(12) United States Patent
Meister et al.

(10) Patent No.: US 11,073,583 B2
(45) Date of Patent: Jul. 27, 2021

(54) NMR SPECTROMETER WITH QUICK-CHANGE SYSTEM FOR SAMPLES

(71) Applicant: Bruker Switzerland AG, Faellanden (CH)

(72) Inventors: Roger Meister, Hinteregg (CH); Reto Schmid, Winterthur (CH); Sven Sieber, Seegraeben (CH)

(73) Assignee: BRUKER SWITZERLAND AG, Faellanden (CH)

( * ) Notice: Subject to any disclaimer, the term of this patent is extended or adjusted under 35 U.S.C. 154(b) by 0 days.

(21) Appl. No.: 16/827,856

(22) Filed: Mar. 24, 2020

(65) Prior Publication Data

US 2020/0309879 A1    Oct. 1, 2020

(30) Foreign Application Priority Data

Mar. 25, 2019  (EP) .................................... 19164940

(51) Int. Cl.
*G01R 33/46* (2006.01)
*G01N 24/08* (2006.01)
(52) U.S. Cl.
CPC ............. *G01R 33/46* (2013.01); *G01N 24/08* (2013.01)
(58) Field of Classification Search
CPC ...... G01N 24/08; G01R 33/307; G01R 33/31; G01R 33/46
See application file for complete search history.

(56) References Cited

U.S. PATENT DOCUMENTS 4,581,583 A  *  4/1986  Van Vliet ............... G01R 33/28
                                                            324/321
4,859,948 A      8/1989  Kuster
                         (Continued)

FOREIGN PATENT DOCUMENTS

DE          3729819 C2    3/1989
DE     102004029633 B4    1/2006
              (Continued)

OTHER PUBLICATIONS

"Bruker Sample Transport BST Installation and Technical Manual.", Brochure by Broker BioSpin AG, Nov. 2008, 30 pages.
(Continued)

*Primary Examiner* — Jay Patidar
(74) *Attorney, Agent, or Firm* — Edell, Shapiro & Finnan, LLC

(57) ABSTRACT

An NMR spectrometer (1) with a magnet system (2), which has a bore (3) through the magnet center (4) for inserting a measuring sample (5) in a transport container (7), and with a transport device for pneumatic transport of the sample through a transport channel (8) into and out of the magnet system. The transport device includes a mechanical interface (9) with a mounted exchange system (10) which has parking receptacles (11) temporarily storing the transport containers. In a transport position, the parking receptacle is inserted into the transport channel, to be loaded with a transport container, removed from the transport channel for temporarily storing the transport container, and reinserted into the transport channel for further transport of the transport container. In the transport position, the parking receptacle forms a part of the transport channel, which permits a faster automated change of the measuring samples in short measurement cycle times.

17 Claims, 4 Drawing Sheets

(56) References Cited

U.S. PATENT DOCUMENTS

| | | | | |
|---|---|---|---|---|
| 5,534,780 A | * | 7/1996 | Lilly | G01R 33/307 |
| | | | | 324/321 |
| 7,521,929 B2 | * | 4/2009 | Tsuchiya | G01R 33/307 |
| | | | | 324/307 |
| 8,217,655 B2 | | 7/2012 | De Vries et al. | |
| 9,726,735 B2 | | 8/2017 | Schmidig et al. | |
| 2005/0280415 A1 | | 12/2005 | Hofmann et al. | |
| 2009/0072830 A1 | * | 3/2009 | Reiss | G01R 33/46 |
| | | | | 324/321 |
| 2015/0198681 A1 | * | 7/2015 | Chintalapati | G01R 33/307 |
| | | | | 324/321 |

FOREIGN PATENT DOCUMENTS

| | | |
|---|---|---|
| DE | 102013212312 B4 | 12/2014 |
| EP | 2199816 B1 | 6/2010 |

OTHER PUBLICATIONS

Schumann, "NMR in Automation, Tools & Tricks", Sep. 4, 2019, 29 pages.

* cited by examiner

NMR SPECTROMETER WITH QUICK-CHANGE SYSTEM FOR SAMPLES

CROSS REFERENCE TO RELATED APPLICATIONS

This application claims foreign priority under 35 U.S.C. § 119(a)-(d) to European Application No. 19164940.9 filed on Mar. 25, 2019, the entire contents of which are hereby incorporated into the present application by reference.

FIELD OF THE INVENTION

The invention relates to Nuclear Magnetic Resonance (NMR) spectrometer with an NMR magnet system, which has a bore through the magnet center for inserting an NMR measuring sample in a transport container, and with a transport device for the pneumatic transport of the NMR measuring sample through a transport channel into the NMR magnet system and out of the NMR magnet system.

BACKGROUND

In such a system, the transport device comprises a mechanical interface, on which a changing system is mounted which has at least one parking receptacle for temporarily storing a transport container, wherein, in a transport position, the parking receptacle can be inserted into the transport channel in order to be loaded with a transport container, removed from the transport channel for temporarily storing the transport container, and reinserted into the transport channel for further transport of the transport container.

Such an NMR spectrometer—as has already been manufactured and distributed for many years by the applicant—is described in
DE 10 2004 029 633 B4 (=reference [1]).

A transport device for pneumatically transporting the NMR measuring samples is known from the company brochure "Bruker Sample Transport. BST Installation and Technical Manual Version 002" by Bruker BioSpin AG dated 21 Nov. 2008 (=reference [2]), particularly from chapters 2, 3, and 5.7-5.9 of said publication. In the following, such a transport device shall be abbreviated as "BST."

For more than half a century, NMR methods have been used to quickly and accurately analyze the chemical composition of measuring samples or to determine the structure of substances contained in the samples. These can be performed in NMR spectrometers. NMR spectrometers suitable for such purposes are described, for example, in EP 2 199 816 B1 (=reference [3]).

NMR spectroscopy is an efficient method of instrumental analytics. In these NMR methods, the sample is exposed to a strong static magnetic field $B_0$ in a z-direction. This results in an interaction with the nuclear spins of the sample material, particularly for aligning nuclear spins in the measuring substance. The sample is subsequently irradiated with orthogonal high-frequency electromagnetic pulses in the x- or y-direction. In turn, the temporal development of said nuclear spins of the sample generates high-frequency electromagnetic fields which are detected in the NMR apparatus. From the detected RF fields, information about the properties of the sample can be obtained integrally over a specific spatial range. It is particularly possible to deduce the chemical composition and the chemical bonding conditions in the sample from the position and intensity of NMR lines.

The measuring sample usually consists of a cylindrical sample tube with a usually circular, oval, or rectangular cross-section, which contains the solid or liquid measuring substance. The sample tube is closed at least on the side with which it first penetrates the sample head, and is typically located in a spinner. Sample tubes and spinners are transported from outside the magnet into the sample head using the transport device. DE 37 29 819 C2 (=reference [4]) describes a transport device for transporting a transport material between an entry point, at which the transport material can be inserted into and removed from the transport device, and a feed point, at which the transport material can be fed to a room temperature bore of a cryostat, wherein the transport material comprises an NMR measuring sample and a sample holder. The entry point is spaced apart from the feed point both horizontally and vertically, and a transport tube for pneumatically transporting the transport material within the transport tube is provided from a first transfer point at the lower end of the transport tube to a second transfer point at the upper end of the transport tube.

In the following, it is assumed that there is a feed opening at the top of the sample head and the sample tube is inserted from above into the sample head. However, it is also possible to insert the sample tube in the sample head from below into an opening provided for such purpose. This case is analogous to the above-mentioned case and, for reasons of simplicity, shall not be described in detail herein. When the sample tube is located in the measuring position, the spinner is located inside a turbine. The turbine allows for a rotation of the sample tube (see, for example, DE 10 2013 212 312 B4=reference [5]).

In order to ensure the shortest possible dead time for the NMR system between two consecutive measurements, it should be made possible to replace a measuring sample already measured in the magnet center as quickly as possible with a new sample still to be measured.

With the currently available systems, a measuring sample is transported by a transport device from the magnet center to the upper side of the NMR spectrometer and from there transported away by an automation system. This automation system deposits the already measured measuring sample in a magazine and picks up a further, usually still unmeasured measuring sample which it then again transports to the transport device, from where it passes through the transport device to once again reach the magnet center for an NMR measurement. It is furthermore possible to have a plurality of measuring samples already available at a desired measuring temperature in a preheating or cooling station outside the NMR spectrometer. This approach has two disadvantages: The NMR spectrometer must wait for the automation system until the latter has provided the new measuring sample. Due to the relatively long transport path between the preheating or cooling station and the measuring position in the NMR spectrometer, the measuring samples are not (or no longer) at a specific temperature desirable for the NMR measurement.

An automated, compact quick-change system equipped for sample tempering would therefore be greatly advantageous for all such NMR spectrometers.

The device according to reference [1] describes a quick-change system with a magazine, arranged at some spatial distance outside the NMR spectrometer, which can receive a multiplicity of sample carriers, wherein the respective next sample to be measured is transported pneumatically via a feed line to the measuring position in the NMR spectrometer and after the measurement subsequently transported back to the magazine via a separate return line. The connection between magazine and spectrometer, i.e., the feed or the return path, is selected by with two switch devices which are positioned in the sections shared by the two lines at the beginning and at the end of the lines.

In the feed line, also arranged at a spatial distance outside the NMR spectrometer preferably in the magnetic stray field of the NMR apparatus and between the two switches, a heated parking position is provided, in which sample vessels can be temporarily stored and tempered. According to FIG. 1 in reference [1], the parking position between the magazine and the NMR system is arranged horizontally.

In addition, the magazine can already be operated in an automatable manner because it can be equipped with a programmable selection device for sample vessels.

However, even in the NMR apparatus according to reference [1], relatively long design-related transport paths of the tempered samples from the parking position to the magnet center of the spectrometer and thus corresponding long waiting times cannot be avoided. Therefore, at the beginning of the NMR measurement, the respective sample is frequently no longer at its optimal temperature, and a quick change and thus a high throughput of the samples is also significantly "decelerated." The switches provided in the apparatus according to reference [1] also require a further extended travel of the samples, which in turn further increases the "travel time." Furthermore, the transport system of reference [1] comprises two transport lines for feeding or returning the sample, and switches for switching between the transport lines. The feed line is also interrupted by the parking position and is continued laterally offset in the direction of the NMR system.

SUMMARY

Problem Addressed by the Invention

In contrast, one object of the present invention is to modify an NMR spectrometer of the initially defined type with the simplest possible technical measures such that the disadvantages listed above are completely or at least largely avoided, without causing a decrease in the quality of NMR measurements. A further object is to provide an NMR apparatus that is particularly compact and controls additional material costs and further manufacturing costs so as to be largely irrelevant.

The present invention further addresses the problem of allowing for a faster, automated change of the measuring samples in order to achieve short measurement cycle times. In addition, the invention should make an efficient and quick pre-tempering of the measuring samples possible, so that an NMR experiment can be started immediately and without further preparation time directly after the transport of the respective measuring sample into the magnet center, thus significantly reducing the cycle times.

BRIEF DESCRIPTION OF THE INVENTION

This complex problem is solved in a surprisingly simple and effective manner in that the changing system of an NMR spectrometer of the type in question with the initially defined features is modified such that, in the transport position, the parking receptacle forms part of the transport channel.

For loading and unloading the samples, the NMR spectrometer modified according to the invention requires no switch, as is absolutely necessary, e.g., in the arrangement according to reference [1]. As a result, the travel of each individual measuring sample is significantly reduced. The switch function is now integrated in the changing system, which also saves space.

The feed and removal of each measuring sample always takes place through the same transport channel. Only the corresponding parking receptacle in the changing system is pushed back and forth. By contrast, in the arrangement according to reference [1], two different transport paths are always provided, on which the center of the NMR magnet system is loaded with a new measuring sample, and on which the measuring sample is unloaded again after the measurement.

Since the parking receptacle, in the transport position, forms a part of the transport channel, the transport device according to the invention—unlike the thus far standard designs, e.g., according to reference [1]—has a changing system mounted directly on the mechanical interface to external devices of the NMR spectrometer with one or more parking receptacles, in which a measuring sample with a transport container can be parked. The transport device is coupled directly to the open end of the magnet bore and the mechanical interface, and the changing system is coupled at a small distance of approximately 50 mm to 200 mm, preferably about 80 mm, above the open end of the bore. As a result, changing a measuring sample is possible much faster than has been possible before with the known systems.

In the respective parking position of the parking receptacles, the measuring samples can additionally also be tempered individually and thus optimally during their parking duration, before they are transported—by the shortest path—from their parking receptacle to the center of the magnet system for an NMR measurement.

Precisely because of the possibilities opened up by the invention of such an automated quick feed of—ideally even individually pre-tempered—NMR measuring samples, it is now possible to keep the NMR measurement cycle very short, since pre-tempering and further upstream processes can be easily factored out and need no longer, unnecessarily, prolong the NMR measurement cycle. The fast tempering allows for shorter cycle times, which is a significant economic factor in the measurement of large numbers of NMR measuring samples. Precisely because of this temporal shortening of the measurement cycle, the invention provides great economic advantages for the user of the NMR spectrometer because considerably more measurements can be performed during the same time.

At this juncture, it should be expressly pointed out that the advantages of the invention can be achieved not only in vertical NMR spectrometers, but also in NMR systems with a horizontal or oblique z-axis. As a result, the specified axial positions must no longer necessarily be "above" or "below" the NMR magnetic coil system but can optionally also be "to the right" or "to the left" of said system. In any case, gravity plays a minor role in the principle of operation of the present invention at least in case of NMR measurements of solids.

PREFERRED EMBODMENTS OF THE INVENTION

For the automation of the sample transport, the NMR spectrometer according to the invention will usually have one or more sensor devices at the interface and/or in the changing system and possibly also in the bore of the NMR magnet system for the current detection of a transport container.

In a preferred class of embodiments of the invention, the changing system has a lock mechanism which can either block or release the passage of the transport container into the NMR magnet system. The design of a parking receptacle with a solid lock mechanism is also possible. Through such a mechanism, a transport container is caught during the introduction into the NMR magnet system. The forwarding to the measuring position can be achieved in different ways depending on the design of the sample container. For example, for transport containers closed on all sides, a rotatable parking receptacle is possible, which is rotated within the changing system such that, for the forwarding of the transport container, it is inserted into the transport position after being rotated by 180°, thus again forming a part of the transport channel.

However, a lock mechanism, which can either block or release the passage of the transport container into the NMR magnet system, is preferred. In order to securely hold the transport container during the parking duration and in the parking position within the parking receptacle, the transport container is held securely in the interior of the parking receptacle by the lock mechanism. For the subsequent further pneumatic transport of the measuring sample for NMR measurement via the transport channel into the measuring area of the magnet system, the lock mechanism releases the transport container as soon as the parking receptacle is in the transport position, so that the transport container can be moved through the transport channel into the magnet.

A particularly advantageous development of these embodiments is characterized in that the at least one parking receptacle has lock openings, through which the lock mechanism can engage with the transport container of the parking receptacle.

Even for reasons of space, it is probably the simplest mechanical way to let the lock mechanism affect the transport container laterally through the wall of the parking receptacle via lock openings. However, other solutions are also conceivable, for example, an engaging of the lock mechanism in the transport container through an upper or lower opening of the parking receptacle, through which the transport container can be moved into and subsequently out of the parking receptacle.

In a preferred variation of this development, the at least one parking receptacle has lock openings, through which the lock mechanism can engage with the transport container of the parking receptacle.

Each parking receptacle has its own lock mechanism, which is thus part of the parking receptacle. The specific design of the lock mechanism as a system of locking pins—acting laterally through the lock openings on the transport container—should represent a structurally particularly simple and safely acting solution.

Also preferred are embodiments of the NMR spectrometer according to the invention, in which the changing system for transporting a transport container out of the NMR magnet system and through the changing system comprises an azimuthally closed through-tube which is open at its axial ends and which can be inserted into the transport position.

The through-tube is used for the direct pneumatic return transport of a sample already measured in the measuring area of the magnet system out of the magnet, through the changing system and toward the outside of the spectrometer. For this purpose, the through-tube is pushed into the section of the transport channel, in which at other times, a parking receptacle can be located—on the transport position—for receiving or forwarding a new measuring sample into the magnet center.

Since the through-tube is closed azimuthally, less pressure escapes from the pneumatic drive system of the transport device. The through-tube is preferably also used when no tempering of the NMR measuring sample and/or no high sample throughput with the NMR spectrometer is required.

Depending on the specific purpose of application, embodiments of the NMR spectrometer according to the invention, in which the changing system contains a multiplicity of, preferably up to twelve, parking receptacles, can be particularly beneficial.

This can be advantageous if the heating (or cooling) time of a measuring sample is longer than the time of the actual NMR measurement. With a simultaneous heating or cooling in the parking position of the parking receptacle, the tempering process can additionally take place slowly and thus extremely gentle for the sample substance. Furthermore, a prolonged tempering period, irrespective of the NMR measurement time, can be desirable in order to control any chemical or biological processes in the measuring sample. If the measurement is only very short, and the main changing system is thus possibly too slow to fill the present changing system, it is at least possible with a plurality of positions to perform quick measurements in batches. A plurality of parking receptacles allows for more time to heat up an individual sample. The temperature or the size of the temperature change can therefore be adjusted very moderately, which is advantageous for some samples. This also allows for several samples to be kept at different temperatures.

A changing system designed according to these embodiments can be modified by a movable, particularly linearly moveable or rotatable carriage which carries one of the parking receptacle and a through bore, which forms a part of the transport channel in the transport position. Per parking receptacle, the carriage preferably comprises at least one lock mechanism of the type described above.

Therefore, particularly preferred is a class of embodiments of the NMR spectrometer according to the invention, in which the changing system has a tempering device, with which a transport container temporarily stored in said parking receptacle, particularly the NMR sample in the transport container, can be heated and/or cooled. For example, in the device according to reference [1], a cooling of the samples in the parking position is not possible; at best, they can be cooled in a refrigeration cabinet, in which the magazine can be accommodated. However, a tempering of the NMS measuring sample close to the measuring position can herewith be achieved directly in the changing system, optionally also for only one parking receptacle.

In advantageous developments of this class of embodiments, the tempering device comprises a heating resistor and/or a Peltier element and/or a hot air supply and/or an infrared radiation source and/or microwave radiation source.

Alternatively or additionally, in developments of this class of embodiments, the tempering device can have a device for compressed air expansion and/or a device for cold air supply. Depending on the temperature range and measuring sample type, a specifically adapted heating or cooling method can be selected which is optimal for the respective sample.

Preferred developments can also be characterized in that the one parking receptacle comprises at least one tempering opening for access of the tempering device to the NMR measuring sample in the transport container.

In order to be able to carry out the tempering of the sample in the parking position of the parking receptacle as directly and efficiently as possible, the tempering device, due to the tempering opening, has direct access through the wall of the parking receptacle to the transport container with the sample.

Variations of these preferred developments are characterized in that the changing system has at least one pivotable heating or cooling jaw for tempering the transport container with an NMR measuring sample, wherein, in a tempering position of the parking receptacle, the pivotable heating or cooling jaw reaches through the tempering opening.

One possibility for sample tempering in the parking receptacle, which is particularly easy to realize technically, is that of providing pivotable tempering elements in the form of heating or cooling jaws, which, if necessary, can act directly on the transport container.

In further developments, preferably each parking receptacle has its own electronic control device for adjusting the temperature of the NMR measuring sample in the temporarily stored transport container. As a result, the NMR measuring samples can be automatically kept at different temperatures, and the temperature profile in each individual measuring sample can have its individual shape.

Particularly advantageous variations of these developments are characterized in that the control device is designed such that it can temper the NMR measuring sample in the temporarily stored transport container along a predetermined temporal temperature profile.

Finally, these variations can be further improved in that the predetermined temporal temperature profile is defined such that a desired temperature of the NMR measuring sample is reached as quickly as possible without exceeding a predetermined maximum temperature. This prevents a possible destruction of the measuring substance.

If the target temperature is close to or equal to the maximum temperature, the parking receptacle must necessarily be brought as close as possible to the transport device in order to minimize the transport time, during which the temperature of the NMR measuring sample changes due to environmental influences.

Furthermore, embodiments of the NMR spectrometer according to the invention are of great advantage, which are also characterized in that the NMR spectrometer is designed such that an airflow is guided around at least one parking receptacle, which flows around the NMR measuring sample and keeps away or removes the moisture precipitating onto the NMR sample from air condensation. An essential advantage of such an arrangement is that the measuring sample does not insert moisture into the NMR measuring system, which could lead to contamination and damage. In addition, such moisture can fundamentally interfere with the NMR measurement.

The invention can be used particularly advantageously in NMR spectrometers that are designed for fluid measurements and in which the NMR measuring sample contains a liquid substance. For transporting the liquid sample in the transport container, the axes of the transport device and the transport channel are then aligned essentially parallel to the force of gravity.

While the arrangement shown in reference [1] is only suitable for solid-state NMR, it is supposed to also be possible to use the present invention for equipping a spectrometer for measuring liquid NMR samples. When transporting a liquid measuring sample, it is highly desirable that the fluid cannot leak from the sample tube and is possibly poured out in the process. Therefore, the spectrometer according to the invention is geometrically designed such that the axes of the transport device and the transport channel are aligned parallel to the direction of gravity in each operating position. In this case, angular deviations of up to ±5° are still tolerable. Incidentally, due to this upright transport, the heatable feed lines mentioned in reference [1] can no longer be implemented herein. Conversely, in the device according to reference [1], a transport of the sample vessels is in sections explicitly also provided in a horizontal position, which precludes the use of liquid NMR samples in transport containers customary for such purpose.

In such an NMR spectrometer modified for measuring liquid samples, the transport device and the changing system for receiving and transporting the transport container thus have hollow spaces with a height greater than the maximum length of the transport container, and which are designed and geometrically arranged such that they run in extension of the cylinder axis of the transport channel and/or parallel thereto, and so the transport container with the NMR measuring sample can always be transported through said hollow spaces in an upright position, i.e., with its axis parallel to the cylinder axis of the transport channel.

For practical reasons, the transport channel, the at least one parking receptacle, and optionally the through-tube for the NMR spectrometer according to the invention are generally each designed to be cylindrical.

Since the transport containers usually also have a cylindrical shape, the simplest solution is to also design the hollow spaces of the transport channel, the parking receptacles, and the through-tube in a cylindrical manner.

The scope of the present invention also includes a method for operating an NMR spectrometer according to the invention of the type described above, comprising the following steps:

(a) feeding a first transport container arriving from the outside with a first NMR measuring sample through the transport channel into the magnet center in the bore of the NMR magnet system and inserting at least one further transport container arriving from the outside with a further NMR measuring sample into a parking receptacle of the changing system and temporarily storing it during a parking duration $t_p$;
(b) performing an NMR measurement on the first NMR measuring sample;
(c) pneumatic return transport of the first transport container with the first NMR measuring sample from the magnet center to the outside of the NMR magnet system;
(d) pneumatic further transport of one of the temporarily stored further transport containers with a further NMR measuring sample from the parking receptacle of the changing system into the magnet center.

A considerable advantage of this method is a quick change of the respective sample to be measured.

Advantageous developments of this method are characterized in that up to twelve further transport containers arriving from the outside, each containing a further NMR measuring sample, are each inserted pneumatically into one of the parking receptacles of the changing system, are temporarily stored during a parking duration between $t_p$ and $12 \cdot t_p$, fed to an NMR measurement in the magnet center and subsequently transported back pneumatically from the magnet center to the outside of the NMR magnet system.

Alternatively or additionally, developments of the method according to the invention can also be used, in which the further NMR measuring samples are tempered, particularly heated and/or cooled, preferably in an electronically controlled manner, during the temporary storage of their respective transport container in one of the parking receptacles of the changing system.

Particularly preferred are variations of these developments, which are characterized in that the NMR measuring samples are tempered in one of the temporarily stored transport containers along a predetermined temporal temperature profile.

These process variations can be further improved by tempering the NMR measuring samples in one of the temporarily stored transport containers such that a desired temperature of the respective NMR measuring sample is reached as quickly as possible without exceeding a predetermined maximum temperature.

Finally, a particularly advantageous development of the method according to the invention described above is characterized in that dry air flows around the NMR measuring sample during the temporary storage of its transport container in one of the parking receptacles of the changing system.

Further advantages of the invention shall become apparent from the description and the drawings. According to the invention, the above-mentioned and in the following described features can each be used in isolation or as a plurality in any combination. The embodiments shown and described are not to be interpreted as an exhaustive list but rather have exemplary character for the description of the invention.

BRIEF DESCRIPTION OF THE DRAWINGS

The invention is shown in the drawings and shall be explained in more detail using embodiments.

DETAILED DESCRIPTION

Figure 1:
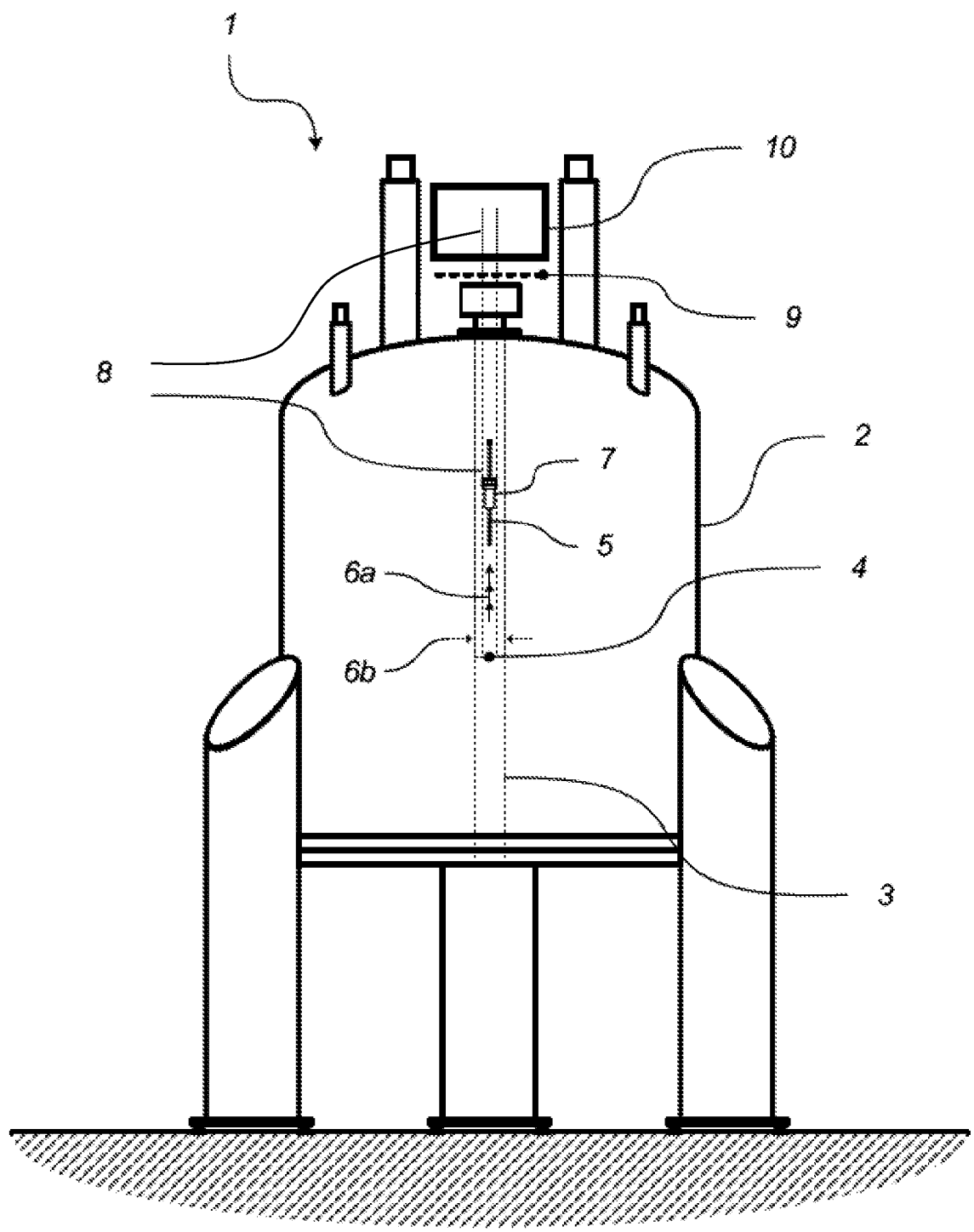
FIG. 1 shows a schematized, partially transparent side view of an embodiment of the NMR spectrometer according to the invention.

In general, the present invention is concerned with a modified NMR spectrometer 1. The advantages of the invention can also be used in a spectrometer with a different physical measurement technology, in which case, appropriate suitable modifications must be made.

The invention develops an NMR spectrometer 1 of the type in question with an NMR magnet system 2, which has a bore 3 through the magnet center 4 for inserting NMR measuring samples 5, and with a transport device for pneumatically transporting the NMR measuring samples 5 in a transport container 7 through a transport channel 8, feeding them into the magnet center 4 for an NMR measurement and transporting them back from the NMR magnet system 2. The transport device comprises a mechanical interface 9 to external devices which is arranged at an open end of the bore 3 and on which a changing system 10 is mounted. The changing system 10 has at least one parking receptacle 11 for temporarily storing a transport container 7. In a transport position, the parking receptacle 11 can be inserted into the transport channel 8 in order to be loaded with a transport container 7, removed from the transport channel 8 for temporary storage of the transport container 7, and reinserted into the transport channel 8 for further transport of the transport container 7.

Figure 2A:
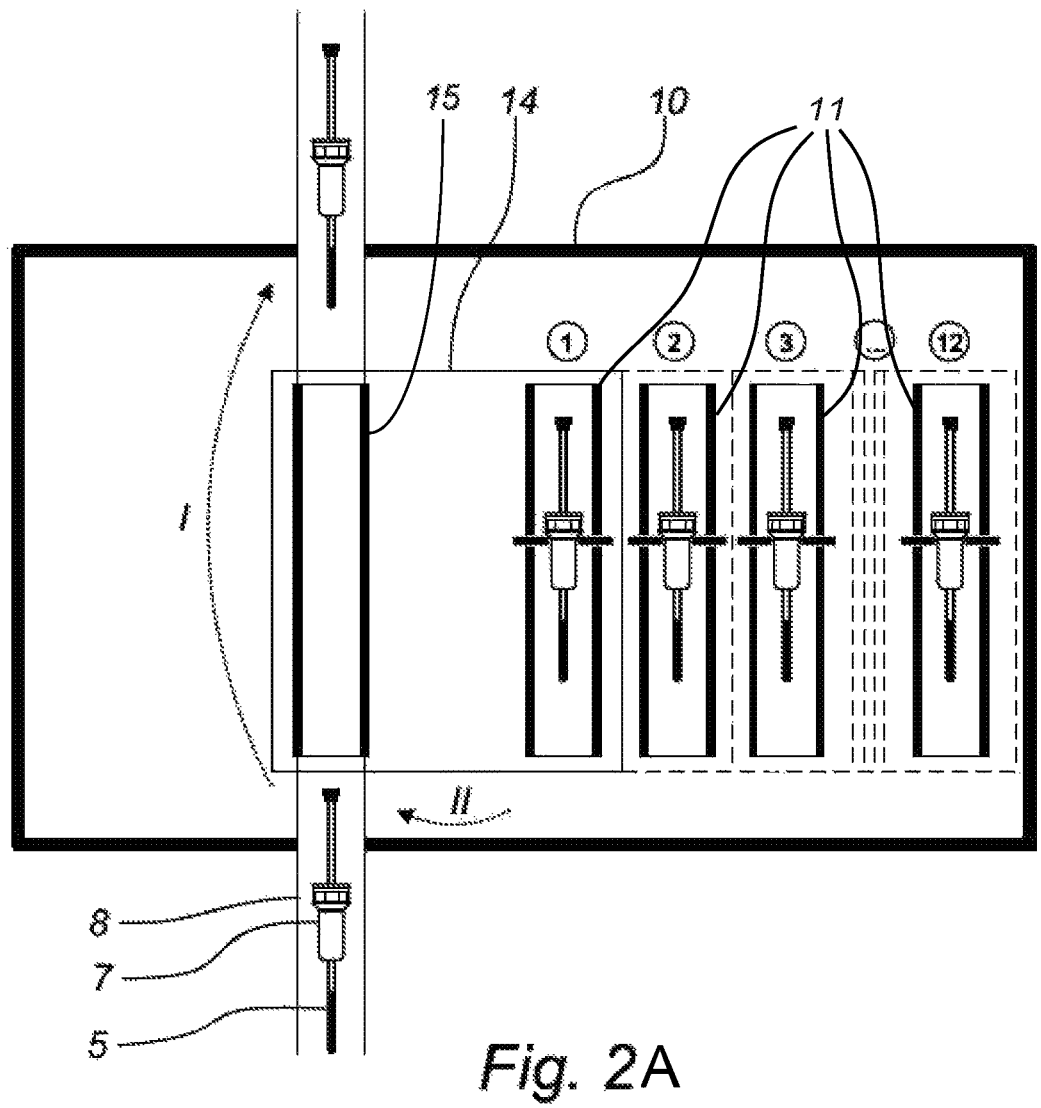
FIG. 2A shows a schematic vertical sectional view from the side of a changing system with a multiplicity of (in this case twelve) parking receptacles in an operating position for ejecting a most recently measured sample from the magnet center of the magnet system.
Figure 2B:
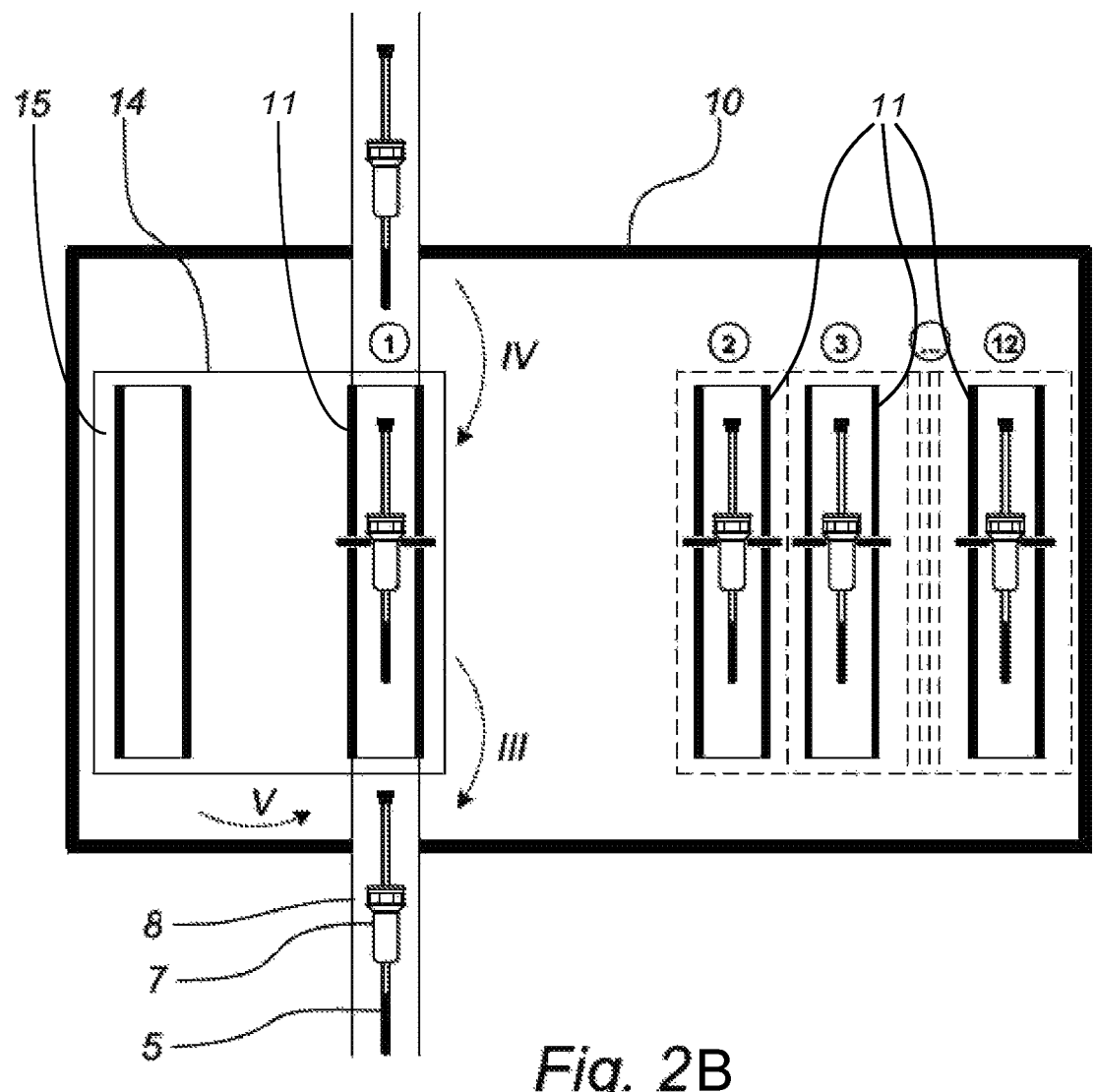
FIG. 2B shows the same as FIG. 2A, but in an operating position for transferring a new sample to be measured from the changing system into the magnet center of the magnet system, and loading the most recently vacated parking receptacle of said new sample to be measured with a further sample from outside the NMR spectrometer.

In contrast to prior art systems, the present invention is characterized in that, in the transport position, the parking receptacle 11 forms a part of the transport channel 8, which is particularly shown schematically in FIG. 2B.

The changing system 10 according to the invention with one or more temporary storages in the form of parking receptacles 11, in which NMR measuring samples 5 can be parked with their respective transport container 7, is novel especially in that it is mounted directly on the mechanical interface 9 to external devices of the NMR spectrometer 1. For such purpose, the transport device is arranged directly on the open end of the magnet bore 3. The mechanical interface 9 and the changing system 10 are coupled at a small distance above the open end of the magnet bore 3. The distance between the changing system 10 and the magnet bore 3 is approximately 50 mm to 200 mm, preferably about 80 mm. Due to this compact arrangement and the immediate proximity of the changing system 10 to the magnet center 4, changing a measuring sample is possible much faster than before.

The parking receptacles 11 in the changing system 10 are used for temporarily storing a transport container 7 arriving from the outside with an NMR measuring sample 5 during a parking duration $t_p$, wherein, during this parking duration $t_p$, another NMR measuring sample 5 is arranged for measurement in the magnet center 4. Each parking receptacle 11 is moveable within the changing system 10 such that it is inserted into the transport channel 8 in order to be loaded with a further transport container 7 arriving from the outside, removed from the transport channel 8 for temporary storage of the transport container 7 during the parking duration $t_p$, and reinserted into the transport channel 8 for further transport of the measuring sample 5 of the temporarily stored transport container 7 for measurement in the magnet center 4. In the transport position, the respective parking receptacle 11 thus forms a part of the transport channel 8.

In the NMR spectrometer 1 according to the invention, an airflow is preferably guided around at least one parking receptacle 11, preferably around all parking receptacles 11. This airflow flows around the NMR measuring sample 5 and keeps away or removes the moisture precipitating onto the NMR sample 5 from air condensation.

The changing system 10 can contain a multiplicity of parking receptacles 11. The embodiment shown schematically in FIGS. 2A and 2B contains exactly twelve parking receptacles 11.

Figure 3:
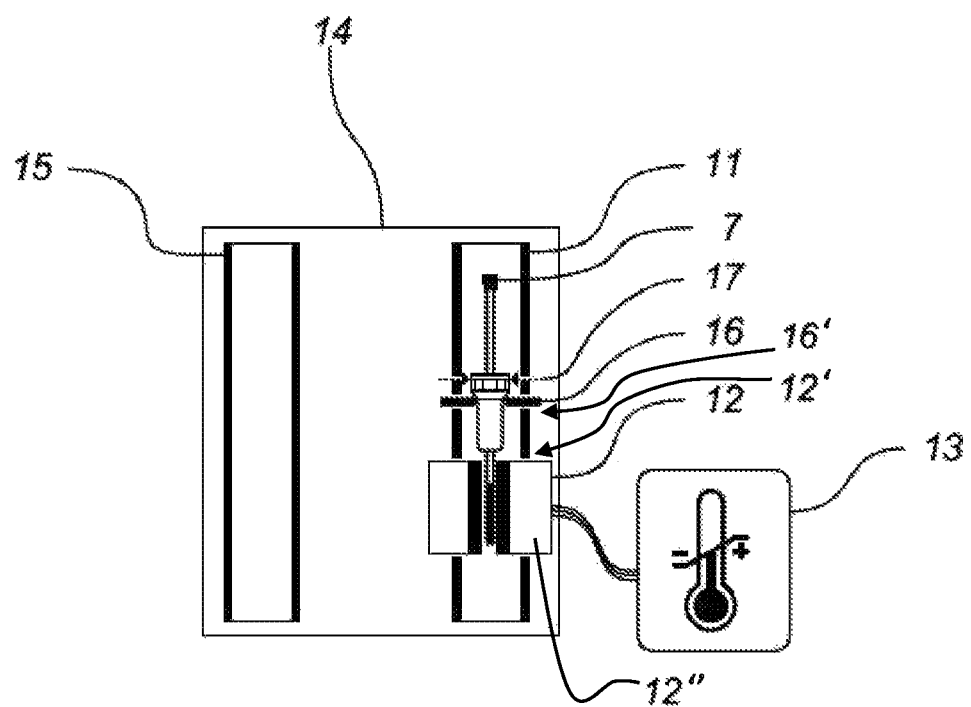
FIG. 3 shows an enlarged schematic detailed view of a parking receptacle, which can be tempered in a controlled manner, and a through-tube for the quick ejection of the last measured sample from the magnet system to the outside of the NMR spectrometer.

The parking receptacle 11 shown in FIG. 3 further contains a tempering device 12, with which a transport container 7 temporarily stored in the parking receptacle 11, particularly the NMR measuring sample 5 in the transport container 7, can be heated and/or cooled.

In detail, this tempering device 12 can be designed in different ways. For example, it can comprise a heating resistor and/or a Peltier element and/or a hot air supply and/or an infrared radiation source and/or a microwave radiation source and/or a compressed air expansion device and/or a cold air supply.

The parking receptacles 11 have tempering openings 12' for an access of the tempering device 12 to the NMR measuring sample 5 in the transport container 7. In the embodiment shown in FIG. 3, the parking receptacle 11 in the changing system 10 has two pivotable heating or cooling jaws 12" for tempering the NMR measuring sample 5 in the transport container 7, which engage in a tempering position of the parking receptacle 11 through the tempering opening 12'.

Of course, such heating or cooling jaws 12" can also be realized in embodiments with a plurality of parking receptacles 11, and in such case preferably at each of the parking receptacles 11. However, for the sake of clarity, they are not specifically shown in FIGS. 2A and 2B. Also included are embodiments of the changing system 10 according to the invention in which a multiplicity of parking receptacles 11 is present, each having one or more tempering openings 12', but wherein only a single arrangement of pivotable heating or cooling jaws 12" is provided, which, in a specific tempering position, can act on the parking receptacle 11 located at said tempering position.

The NMR spectrometer 1 according to the invention is usually controlled electronically. This naturally also applies to subunits, such as the above-described changing system 10, its parking receptacles 11, and the tempering device 12. Each parking receptacle 11 will preferably have its own electronic control device 13 for controlling the temperature of the NMR measuring sample 5 in the temporarily stored transport container 7, as depicted in the schematic embodiment of FIG. 3.

The control device 13 can be designed such that it can temper the NMR measuring sample 5 in the temporarily stored transport container 7 along a predetermined temporal temperature profile. The predetermined temporal temperature profile is preferably defined such that a desired temperature of the NMR measuring sample 5 is reached as quickly as possible without exceeding a predetermined maximum temperature.

A changing system 10 designed according to the invention can—as indicated in FIGS. 2A, 2B, and 3—have a movable, particularly linearly moveable or rotatable carriage 14 which carries one of the parking receptacles 11 and an azimuthally closed through-tube 15 which is open at its axial ends and forms a part of the transport channel 8 in the transport position. When said through-tube 15 is inserted into the transport position, an NMR measuring sample 5 already measured in the magnet center 4 can be transported in its transport container 7 quickly and without an intermediate stop through the changing system 10 out of the NMR magnet system 2 to the outside of the NMR spectrometer 1 in order to free the measuring center for a new sample to be measured from the changing system 10.

The parking receptacles 11 shown in FIGS. 2A, 2B, and 3 each have a lock mechanism 16 which securely holds the transport container 7 after the introduction into the respective parking receptacle 11 and, in the transport position, can allow the passage of the transport container 7 out of the parking receptacle 11 into the magnet center 4.

In the embodiments of the invention shown in the drawings, the parking receptacles 11 each have lock openings 16' for the lock mechanism 16 to engage with the transport container 7 in the parking receptacle 11. In this case, the lock mechanism 16 is part of the respective parking receptacle 11 and in each case comprises a system of locking pins, which can engage through the lock openings 16' with the transport container 7 in the parking receptacle 11.

The parking receptacles 11 of the embodiments in FIGS. 2A, 2B, and 3 each comprise a sensor device 17, with which it can be detected whether or not a transport container 7 is currently located in the parking receptacle 11.

As indicated in FIG. 1, a pneumatic transport for a transport container 7 arriving from the outside into the magnet center 4, and for transporting a transport container 7 coming from the magnet center 4 with a measured sample back to the outside of the NMR magnet system 2 is provided within the transport channel 8. In addition, a sensor device 6b for detecting a transport container 7 can also be arranged in the immediate vicinity of the magnet center 4.

As shown in all the figures of the drawings, the axes of the transport device, the transport channel 8, and all parking receptacles 11 are aligned essentially parallel to gravity, and so in cases, in which the NMR sample 5 contains a liquid substance, the transport containers 7 with the liquid sample are always transported in an upright position. As a result, the liquid is not spilled during transport. In such an NMR spectrometer 1 modified for the measurement of liquid samples, the transport device and the changing system 10 for receiving and transporting the transport container 7 thus have hollow spaces, the height of which is greater than the maximum length of the transport container 7, and which are designed and geometrically arranged such that they run in extension of the cylinder axis of the transport channel 8 and/or parallel thereto, and so each transport container 7 with an NMR measuring sample 5 can always be transported through said hollow spaces in an upright position, i.e., with its axis parallel to the cylinder axis of the transport channel 8.

The invention includes a sample changing system sitting directly on the generally known BST. In this changing system 10, the NMR measuring samples 5 are temporarily stored and pre-tempered. If a measured sample is supposed to be transported from the magnet center 4 upwards in a quick manner by the BST, it is transported directly through the through-tube 15 past the samples in their parking receptacles 11 temporarily stored ("parked") in the changing system 10. Once the measured sample from the magnet center 4 has passed the further samples, the next NMR measuring sample 5 is brought into the transport channel 8 and immediately afterwards transported downwards into the magnet center 4 for an NMR measurement. This reduces the waiting time of the NMR system to the time that is required to move one sample upwards and another sample downwards along a now very short distance. Due to the pre-tempering, the NMR measuring sample 5 to be measured additionally arrives in the magnet center 4 quite accurately at the desired target temperature, and so the NMR measurement can be performed immediately under thermally optimal conditions and without a further waiting time.

The BST adapter commonly used today by Bruker (function: combination of USC shuttle and (glass) sample) and the preheating station frequently already present outside the NMR spectrometer (see reference [1]) are now combined by the invention directly over the BST and supplemented with a sample changing system that can be tempered.

The function of this quick-change system and particularly the sequence of the loading and unloading processes are indicated by the arrows I to V in FIGS. 2A and 2B. In the initial situation, an NMR measuring sample 5 is positioned for and measured with an NMR measurement in the magnet center 4 of the NMR magnet system 2.

The further sequence is as follows:

I. Immediately after completion of the NMR measurement, the measured NMR measuring sample 5 is transported in its transport container 7 out of the magnet center 4 and into the changing system 10 (see FIG. 2A).

II. Once the measured sample passes directly through the through-tube 15 and past the samples parked in the changing system 10, one of the parked samples (number 1 in FIG. 2A) is transported with its parking receptacle 11 to the transport channel 8 on the axis of the NMR system.

III. After the measured sample passes through the changing system 10, the through-tube 15 is moved on the carriage 14 out of its transport position in the transport channel 8, the next intermittently parked sample to be measured (again, the number 1 in FIG. 2B) is moved with its parking receptacle 11 onto the axis of the transport channel 8, and the lock mechanism 16 releases the sample (no. 1) which is lowered for an NMR measurement from its parking receptacle 11 into the magnet center 4.

IV. Once the NMR measuring sample 5 (no. 1 in FIG. 2B) in its transport container 7 has left its parking receptacle 11, said parking receptacle 11 is loaded with a further sample arriving from outside the NMR spectrometer.

V. The parking receptacle 11 with the newly added sample is transported by the carriage 14 out of the transport channel 8 to a parking position in the changing system 10, where it is pre-tempered. At the same time, the through-tube 15—as a preparation for a quick ejection of the NMR sample 5 currently located in the magnet center 4 after its measurement is completed—is pushed back with the same carriage movement onto the axis of the transport channel 8 in the changing system 10.

The result of this approach is particularly that the dead time, in which no measuring sample can be measured in the NMR magnet, is now only about 10 seconds. In contrast, this minimum waiting time in today's NMR spectrometers according to the prior art is approximately 45 seconds.

LIST OF REFERENCE SIGNS

1 NMR spectrometer
2 NMR magnet system
3 Bore
4 Magnet center
5 NMR measuring sample(s)
6a Pneumatic transport
6b Sensor device
7 Transport container
8 Transport channel
9 Mechanical interface
10 Changing system
11 Parking receptacle(s)
12 Tempering device
12' Tempering opening
12" Heating or cooling jaws
13 Control device
14 Carriage
15 Through-tube
16 Lock mechanism
16' Lock opening(s)
17 Sensor device
I-V Measurement cycle

REFERENCE LIST

Publications considered for the assessment of patentability:
[1] DE 10 2004 029 633 B4
[2] Company brochure Z31123 "Bruker Sample Transport. BST Installation and Technical Manual Version 002" by Bruker BioSpin AG from Nov. 21, 2008
[3] EP 2 199 816 B1
[4] DE 37 29 819 C2
[5] DE 10 2013 212 312 B4

What is claimed is:

1. Nuclear Magnetic Resonance (NMR) spectrometer with an NMR magnet system, which has a bore extending through a magnet center for inserting an NMR measuring sample in a transport container, and with a transport device configured to pneumatically transport the NMR measuring sample through a transport channel into the NMR magnet system and out of the NMR magnet system, wherein the transport device comprises:
   a changing system comprising at least one parking receptacle for temporarily storing the transport container, and
   a mechanical interface on which the changing system is mounted,
wherein the at least one parking receptacle is inserted into the transport channel to form part of the transport channel for loading with the transport container, is removed from the transport channel for temporarily storing the transport container, and is reinserted into the transport channel to form part of the transport channel for further transporting the transport container.

2. NMR spectrometer according to claim 1, wherein the changing system comprises a lock mechanism configured to alternatingly block the transport container from passing into or permit the transport container to pass into the NMR magnet system.

3. NMR spectrometer according to claim 2, wherein the at least one parking receptacle has lock openings through which the lock mechanism engages with the transport container of the at least one parking receptacle.

4. NMR spectrometer according to claim 3, wherein the lock mechanism is part of the at least one parking receptacle and comprises a system of locking pins which engages through the lock openings with the transport container in the at least one parking receptacle.

5. NMR spectrometer according to claim 1, wherein the changing system for transporting the transport container out of the NMR magnet system and through the changing system comprises an azimuthally closed through-tube which is open at axial ends of the through-tube and which is configured to insert into the transport channel.

6. NMR spectrometer according to claim 5, wherein the transport channel, the at least one parking receptacle and the through-tube are each cylindrical.

7. NMR spectrometer according to claim 1, wherein the changing system comprises a plurality of parking receptacles.

8. NMR spectrometer according to claim 1, wherein the changing system comprises a tempering device, with which the transport container with the NMR measuring sample, temporarily stored in the at least one parking receptacle, is heated and/or cooled.

9. NMR spectrometer according to claim 8, wherein the tempering device comprises a heating resistor and/or a Peltier element and/or a hot air supply and/or an infrared radiation source and/or a microwave radiation source and/or a device for compressed air expansion and/or a device for cold air supply.

10. NMR spectrometer according to claim 8, wherein the at least one parking receptacle comprises at least one tempering opening for access of the tempering device to the NMR measuring sample in the transport container.

11. NMR spectrometer according to claim 10, wherein the changing system has at least one pivotable heating or cooling jaw configured to temper the transport container with an NMR measuring sample, wherein, in a tempering position of the at least one parking receptacle, the pivotable heating or cooling jaw reaches through the tempering opening.

12. NMR spectrometer according to claim 8, further comprising an electronic control device controlling the temperature of the NMR measuring sample in the temporarily stored transport container.

13. NMR spectrometer according to claim 12, wherein the control device is configured to temper the NMR measuring sample in the temporarily stored transport container along a predetermined temporal temperature profile, wherein the predetermined temporal temperature profile is defined such that a desired temperature of the NMR measuring sample is reached without exceeding a predetermined maximum temperature.

14. NMR spectrometer according to claim 8, further comprising plural electronic control devices for respective parking spaces and respectively controlling respective temperatures of plural NMR measuring samples in respective temporarily stored transport containers.

15. NMR spectrometer according to claim 1, wherein the NMR measuring sample contains a liquid substance, and wherein, for transporting the liquid sample in the transport container, the transport channel has an axis that is aligned at least essentially in parallel to gravity.

16. NMR spectrometer according to claim 1, wherein the transport channel and the at least one parking receptacle are both cylindrical.

17. Method for operating an NMR spectrometer according to claim 1, comprising:
   (a) feeding a first transport container arriving from outside the NMR magnet system with a first NMR measuring sample through the transport channel into the magnet center and inserting at least one further transport container arriving from outside the NMR magnet system with a further NMR measuring sample into a parking receptacle of the changing system and temporarily storing the further transport container during a parking duration tp;
   (b) performing an NMR measurement on the first NMR measuring sample;
   (c) pneumatically transporting the first transport container with the first NMR measuring sample back from the magnet center to the outside of the NMR magnet system; and
   (d) pneumatically transporting the temporarily stored further transport container from the parking receptacle of the changing system into the magnet center.

* * * * *